United States Patent
Qu et al.

(10) Patent No.: US 12,379,402 B2
(45) Date of Patent: Aug. 5, 2025

(54) MAGNETIC PROBE-BASED CURRENT MEASUREMENT DEVICE, AND MEASUREMENT METHOD

(71) Applicant: MultiDimension Technology Co., Ltd., Zhangjiagang (CN)

(72) Inventors: Pin Qu, Zhangjiagang (CN); Songsheng Xue, Zhangjiagang (CN); Huijuan Wang, Zhangjiagang (CN); Zongxin Liu, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 266 days.

(21) Appl. No.: 17/907,388

(22) PCT Filed: Mar. 24, 2021

(86) PCT No.: PCT/CN2021/082698
§ 371 (c)(1),
(2) Date: Sep. 26, 2022

(87) PCT Pub. No.: WO2021/190556
PCT Pub. Date: Sep. 30, 2021

(65) Prior Publication Data
US 2023/0123660 A1     Apr. 20, 2023

(30) Foreign Application Priority Data
Mar. 27, 2020 (CN) .......................... 202010229149.2

(51) Int. Cl.
*G01R 15/20* (2006.01)
*G01R 19/00* (2006.01)
*G01R 19/32* (2006.01)

(52) U.S. Cl.
CPC ......... *G01R 15/207* (2013.01); *G01R 15/205* (2013.01); *G01R 19/0092* (2013.01); *G01R 19/32* (2013.01)

(58) Field of Classification Search
CPC .. G01R 15/146; G01R 15/148; G01R 15/202; G01R 15/205; G01R 15/207; G01R 19/0092; G01R 19/32
See application file for complete search history.

(56) References Cited

U.S. PATENT DOCUMENTS 4,492,919 A * 1/1985 Milkovic ............. G01R 15/146
                                                    323/357
6,636,029 B1 * 10/2003 Kunze ................. G01R 15/207
                                                    324/251
(Continued)

FOREIGN PATENT DOCUMENTS

CN      103487632 A     1/2014
CN      107860959 A     3/2018
(Continued)

OTHER PUBLICATIONS

WO 2015/115472 and machine translation (Year: 2015).*
(Continued)

*Primary Examiner* — Steven L Yeninas
(74) *Attorney, Agent, or Firm* — Schwegman Lundberg & Woessner, P.A.

(57) ABSTRACT

A magnetic probe-based current measurement device and measurement method is disclosed. The device comprises a conductor for a current under test, a magnetic probe, a magnetic bias structure, and a programmable chip. A conductor has a first axis, a second axis, and a third axis. The conductor is provided with through holes. The direction of the through holes are parallel to the third axis. Vertical projections of the through holes on a first cross section are symmetric about the first axis. At least one of the through (Continued)

holes has a center position located on the first axis. And/or every pair of the through holes have center positions that are symmetric about the first axis. The magnetic probe is provided within the through holes, and is electrically connected to the programmable chip. A sensitive center position of the magnetic probe is located on the first cross section. A vertical projection of the magnetic probe on the first cross section is symmetric about the first axis. The magnetic bias structure is provided within the through holes. A magnetization direction of the magnetic bias structure is perpendicular to a sensitive direction of the magnetic probe. The device is small size and has the advantages of high measurement accuracy, and high adaptability.

13 Claims, 7 Drawing Sheets

(56) References Cited

U.S. PATENT DOCUMENTS

| | | | | |
|---|---|---|---|---|
| 9,176,203 | B2* | 11/2015 | Ivanov | G01R 15/20 |
| 10,416,200 | B2 | 9/2019 | Futakuchi et al. | |
| 10,837,985 | B2 | 11/2020 | Wolf et al. | |
| 11,796,571 | B2* | 10/2023 | Ortner | G01R 15/202 |
| 2009/0021249 | A1* | 1/2009 | Kumar | G01R 15/207 |
| | | | | 324/227 |
| 2015/0160272 | A1* | 6/2015 | Juds | H01H 33/027 |
| | | | | 324/244 |
| 2015/0204916 | A1* | 7/2015 | Akimoto | G01R 15/207 |
| | | | | 702/64 |
| 2015/0204919 | A1* | 7/2015 | Akimoto | G01R 15/207 |
| | | | | 324/244 |
| 2016/0223699 | A1* | 8/2016 | Peczalski | G01R 15/205 |
| 2017/0285076 | A1* | 10/2017 | Okuyama | G01R 33/093 |
| 2018/0149678 | A1 | 5/2018 | Wolf et al. | |
| 2019/0154735 | A1* | 5/2019 | Shimizu | G01R 19/32 |
| 2020/0033384 | A1* | 1/2020 | Kishi | G01R 15/207 |
| 2020/0064417 | A1 | 2/2020 | Shimizu et al. | |
| 2020/0381881 | A1* | 12/2020 | Ortner | G01R 15/205 |

FOREIGN PATENT DOCUMENTS

| | | |
|---|---|---|
| CN | 107889527 A | 4/2018 |
| CN | 109613321 A | 4/2019 |
| CN | 209264810 U | 8/2019 |
| CN | 110741269 A | 1/2020 |
| CN | 111323639 A | 6/2020 |
| WO | WO-2021190556 A1 | 9/2021 |

OTHER PUBLICATIONS

JP 2005-283451 and machine translation (Year: 2005).*
WO 2016/056135 and machine translation (Year: 2016).*
"International Application No. PCT/CN2021/082698, International Search Report and Written Opinion mailed Jun. 1, 2021", (Jun. 1, 2021), 12 pgs.

* cited by examiner

MAGNETIC PROBE-BASED CURRENT MEASUREMENT DEVICE, AND MEASUREMENT METHOD

PRIORITY CLAIM TO RELATED APPLICATIONS

This application is a U.S. national stage filing under 35 U.S.C. § 371 from International Application No. PCT/CN2021/082698, filed on 24 Mar. 2021, and published as WO2021/190556 on 30 Sep. 2021, which claims the benefit under 35 U.S.C. 119 to Chinese Application No. 202010229149.2, filed on 27 Mar. 2020, the benefit of priority of each of which is claimed herein.

TECHNICAL FIELD

Embodiments of the present invention relate to a current measurement technology, and in particular to a magnetic probe-based current measurement device and measurement method.

BACKGROUND

Current measurement is ubiquitous and very important in industries such as power systems, wind power, photovoltaics, frequency converters, traction locomotives, electric automobiles and chemical metallurgy. At present, the commonly used current measurement devices include shunts, current transformers, Hall current sensors, fluxgate current transformers and the like.

The shunts show extremely high accuracy and high response speed in low-frequency and small-amplitude current measurement, but the problems of poor high-frequency characteristic and serious temperature drift cannot be improved fundamentally, and current isolation measurement cannot be performed.

The current transformers, Hall current sensors and fluxgate current transformers can realize current isolation measurement, but it is necessary to amplify the magnetic field by means of a magnetism gathering ring structure to improve the measurement accuracy. During current measurement, the conductor for a current under test needs to pass through a center hole of the measurement device, resulting in that the volume of the measurement device depends on the size of the conductor for a current under test. During high-current measurement, the measurement device is bulky and expensive, thereby limiting wide application. Furthermore, different sizes of conductors for a current under test require different measurement devices, thereby limiting the application range of a single measurement device. Meanwhile, the measurement device depends on the magnetic field generated by the current gathered by the magnetism gathering ring, and cannot control and utilize the magnetic field at the measurement point accurately and effectively.

SUMMARY

Embodiments of the present invention provide a magnetic probe-based current measurement device and a measurement method. The device is small size and has the advantages of high measurement accuracy, and high adaptability.

A magnetic probe-based current measurement device provided by the embodiments of the present invention includes: a conductor for a current under test, a magnetic probe, a magnetic bias structure, and a programmable chip;

the conductor for a current under test has a first axis, a second axis, and a third axis, the first axis is parallel to a current direction of the conductor for a current under test, the second axis and the first axis are perpendicular to each other and form a first cross section, and the third axis is perpendicular to the first cross section;

the conductor for a current under test is provided with through holes, the direction of the through holes is parallel to the third axis, and vertical projections of the through holes on the first cross section are symmetrical about the first axis;

at least one of the through holes has a center position located on the first axis; and/or every pair of the through holes have center positions that are symmetrical about the first axis;

the magnetic bias structure is provided within the through holes, and is electrically connected to the programmable chip, a sensitive center position of the magnetic probe is located on the first cross section, and a vertical projection of the magnetic probe on the first cross section is symmetrical about the first axis;

the magnetic bias structure is provided within the through holes, and a magnetization direction of the magnetic bias structure is perpendicular to a sensitive direction of the magnetic probe;

the magnetic probe is used to acquire a magnetic field signal generated by the current under test introduced into the conductor for a current under test, convert the magnetic field signal into a voltage signal, and transmit the voltage signal to the programmable chip; and the programmable chip is used to process the voltage signal to obtain a target voltage signal, and the target voltage signal corresponds to the current under test.

Optionally, the vertical projections of the through holes on the first cross section are symmetrical about the second axis.

Optionally, in a direction where the first axis is located, a length $L_1$ of the conductor for a current under test and a length $L_2$ of the through holes meet $L_1 \geq 3L_2$.

Optionally, the device further includes a circuit board;

a) the magnetic probe includes M groups of magnetoresistive sensors, each group of the magnetoresistive sensors comprises N pairs of magnetoresistive elements, the magnetoresistive elements are arranged on the circuit board, vertical projections of each pair of the magnetoresistive elements on the first cross section are symmetrical about the first axis, sensitive directions of each pair of the magnetoresistive elements are parallel and opposite to each other, M and N are positive integers, and M≥1, N≥1.

Optionally, the magnetic bias structure and the magnetoresistive elements are arranged on the same side of the circuit board; and/or the magnetic bias structure and the magnetoresistive elements are respectively located on two opposite sides of the circuit board.

Optionally, the shapes of the vertical projections of the through holes on the first cross section include any one of rectangle, circle, and ellipse.

Optionally, the conductor for a current under test is metal, and the cross-section shape of a cross section perpendicular to first axis includes any one of rectangle and circle.

Optionally, the magnetic bias structure is a permanent magnet, and the permanent magnet is made of any one of neodymium iron boron, samarium cobalt, aluminum nickel cobalt and ferrite.

Optionally, the programmable chip includes: a temperature compensation unit, a nonlinear compensation unit and an operational amplifier;

the temperature compensation unit is electrically connected to the magnetic probe, and the nonlinear compensation unit is electrically connected between the temperature compensation unit and the operational amplifier;

the temperature compensation unit is used to perform temperature compensation on the voltage signal output by the magnetic probe to obtain a primary voltage signal;

the nonlinear compensation unit is used to perform nonlinear compensation on the primary voltage signal to obtain a secondary voltage signal; and the operational amplifier is used to linearly amplify the secondary voltage signal to obtain a target voltage signal.

The embodiments of the present invention further provide a magnetic probe-based current measurement method, which is performed by using the current measurement device. The current measurement method includes:

accessing a current under test into the conductor for a current under test;

acquiring a magnetic field signal generated by the current under test through the magnetic probe, converting the magnetic field signal into a voltage signal, and transmitting the voltage signal to the programmable chip; and processing the voltage signal by the programmable chip to obtain a target voltage signal, where the target voltage signal corresponds to the current under test.

According to the embodiments of the present invention, the conductor for a current under test is provided with the through holes that are mirror symmetrical about the first axis, so that after the current under test is introduced into the conductor for a current under test, two parts of the conductor symmetrical about the first axis have the same current intensity; and the magnetic probe is provided within the through holes to detect the magnetic field generated by the conductor for a current under test and convert the magnetic field signal into a voltage signal, and the voltage signal is processed by the programmable chip to obtain a target voltage signal corresponding to the current under test, so information such as the amplitude and phase of the current under test can be determined according to the target voltage signal. In the embodiments of the present invention, the magnetic probe is provided within the through holes of the conductor for a current under test, so that the magnetic field at the measurement point is utilized, and the ability of the measurement device resisting the interference of an external magnetic field is improved, thereby improving the accuracy of the measurement result. In addition, the embodiments of the present invention do not require the magnetism gathering ring structure, thereby completely getting rid of the limitation of the size of the conductor for a current under test on the volume of the current measurement device. Therefore, the measurement device is suitable for different application environments, the applicability and practicability of the measurement device are improved, and it is beneficial to the miniaturization design of the measurement device.

BRIEF DESCRIPTION OF THE DRAWINGS

FIG. 4a is a schematic diagram of magnetic field distribution corresponding to the setting mode in FIG. 2a;

DETAILED DESCRIPTION

Figure 1:
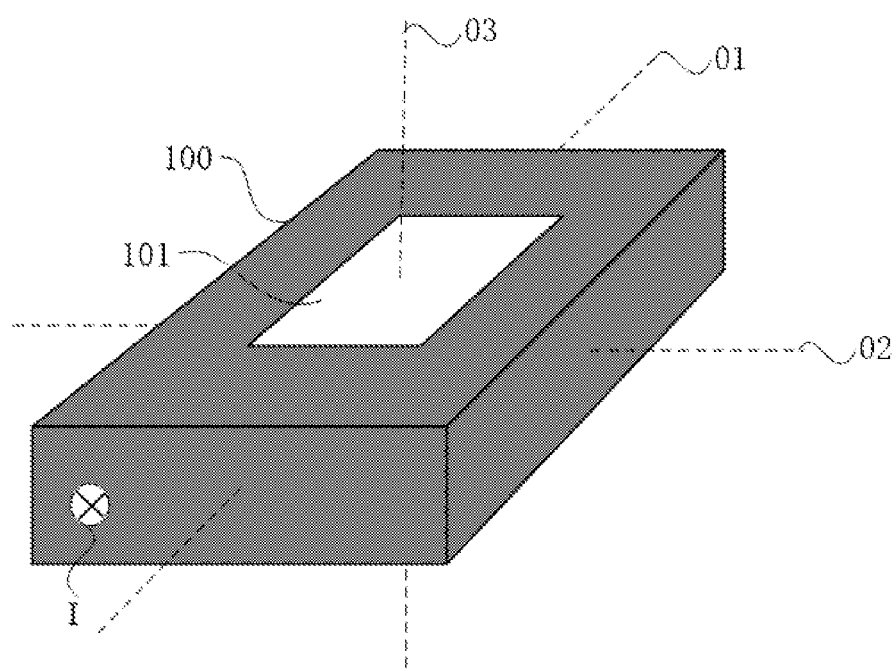
FIG. 1 is a schematic diagram of a three-dimensional structure of a conductor for a current under test according to embodiments of the present invention.

The present invention is further described in detail below with reference to the accompanying drawings and embodiments. It can be understood that the specific embodiments described herein are intended to illustrate the present invention only, but not to limit the present invention. In addition, it should be noted that, to facilitate description, only the parts related to the present invention rather than all structures are shown in the drawings.

Figure 2A:
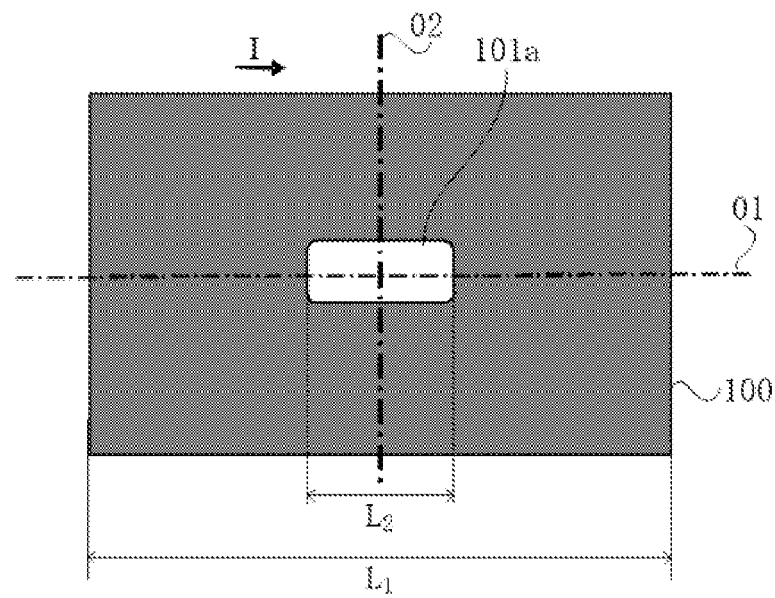
FIG. 2a to FIG. 2c are schematic diagrams of setting modes of a conductor for a current under test and through holes thereof according to embodiments of the present invention.
Figure 2B:
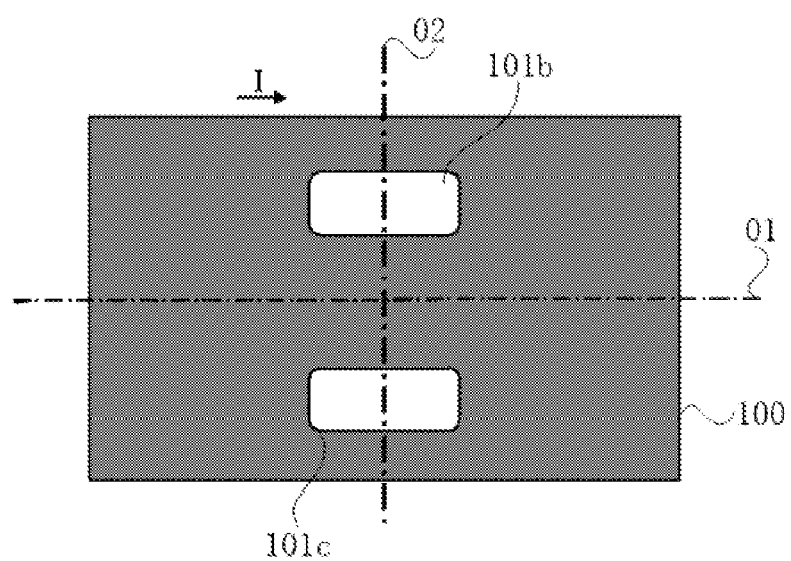
Figure 2C:
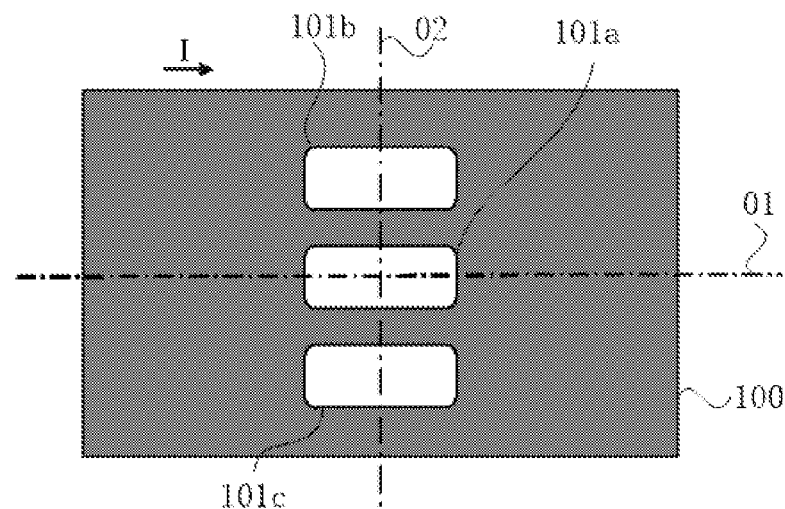
Figure 3:
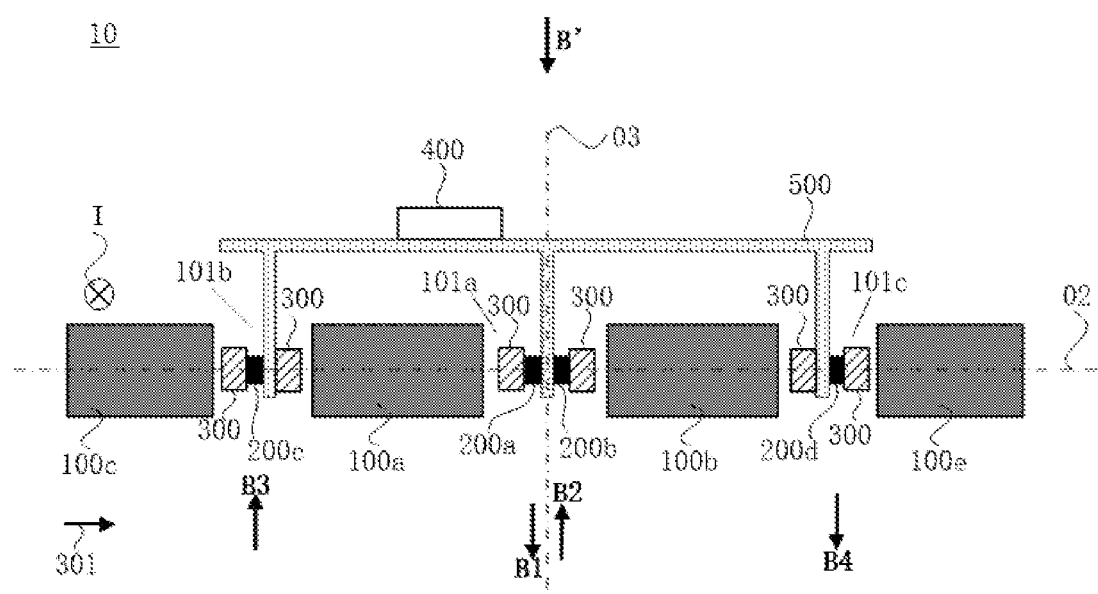
FIG. 3 is a schematic structural diagram of a current measurement device according to embodiments of the present invention.

FIG. 1 is a schematic diagram of a three-dimensional structure of a conductor for a current under test according to embodiments of the present invention so as to illustrate the axis layout of the conductor for a current under test; FIG. 2a to FIG. 2c are schematic diagrams of setting modes of a conductor for a current under test and through holes thereof according to embodiments of the present invention and provide several setting modes of the through holes; and FIG. 3 is a schematic structural diagram of a current measurement device according to embodiments of the present invention and corresponds the setting mode of the through holes shown in FIG. 2c. The current measurement device provided by the embodiments of the present invention and the working principle thereof are described with reference to FIG. 1 to FIG. 3.

Referring to FIG. 3, the current measurement device 10 includes a conductor for a current under test, a magnetic probe, a magnetic bias structure 300, and a programmable chip 400; referring to FIG. 1, the conductor 100 for a current under test has a first axis 01, a second axis 02, and a third axis 03, the first axis 01 is parallel to a current direction I of the conductor 100 for a current under test, the second axis 02 and the first axis 01 are perpendicular to each other and form a first cross section, and the third axis 03 is perpendicular to the first cross section; the conductor 100 for a current under test is provided with through holes 101, the direction of the through holes 101 is parallel to the third axis 03, and vertical projections of the through holes 101 on the first cross section are symmetrical about the first axis 01; referring to FIG. 2a to FIG. 2c, at least one of the through holes has a center position located on the first axis 01; and/or every pair of the through holes have center positions that are symmetrical about the first axis 01; referring to FIG. 3, the magnetic probe is provided within the through holes, and is electrically connected to the programmable chip 400, a sensitive center position of the magnetic probe is located on the first cross section, and a vertical projection of the magnetic probe on the first cross section is symmetric about the first axis 01; the magnetic bias structure 300 is provided within the through holes, and a magnetization direction 301 of the magnetic bias structure 300 is perpendicular to a sensitive direction of the magnetic probe; the magnetic probe is used to acquire a magnetic field signal generated by the current under test introduced into the conductor 100 for a current under test, convert the magnetic field signal into a voltage signal, and transmit the voltage signal to the programmable chip 400; and the programmable chip 400 is used to process the voltage signal to obtain a target voltage signal, and the target voltage signal corresponds to the current under test.

The current under test is a current introduced into the conductor for a current under test. Information, such as amplitude and phase, of the current is consistent with the current information of a circuit to be measured. The conductor for a current under test may be connected in series to the circuit to be measured. The current measurement device detects the current information of the conductor for a current under test to acquire the current information of the circuit to be measured. Optionally, the conductor for a current under test is metal, and the cross-section shape of its cross section perpendicular to first axis 01 includes any one of rectangle and circle. Exemplarily, the cross-section shape of the conductor 100 for a current under test in FIG. 1 is a rectangle, and the conductor 100 for a current under test with the three-dimensional structure shown in FIG. 1 may make the processing of the through holes 101 be simpler.

In the embodiments of the present invention, based on Ampere's law and Biot-Savart law, the distribution of the magnetic field around the conductor for a current under test after current is introduced is subjected to symmetrical analysis, so the following technical solution is obtained: the through holes are formed at specific positions of the conductor for a current under test to change the current trend, thereby changing the distribution of the magnetic field in the through holes; and the magnetic probe is used to detect the intensity of the magnetic field in the through holes, thereby accurately measuring the current of the conductor for a current under test.

It should be noted that FIG. 1 only shows a structural example diagram in which the conductor 100 for a current under test is provided with a through hole 101. In this embodiment, the number of the through holes 101 may be one or multiple. Exemplarily, FIG. 2a to FIG. 2c are schematic structural diagrams of a first cross section of the conductor for a current under test, and respectively provide setting modes of different numbers of through holes.

The first one is as follows: referring to FIG. 2a, the conductor 100 for a current under test is provided with a through hole 101a, the through hole 101a is mirror symmetrical about the first axis 01, and a center of the through hole 101a is located on the first axis 01. It should be noted that, when the center of the through hole is located on the first axis 01, in order to make the cross-section shape of the through hole be symmetrical about the first axis 01, the cross-section shape of the through hole needs to be a regular shape, such as a rectangle, a circle or an ellipse.

It should be noted that FIG. 2a only takes one through hole as an example. A plurality of through holes may be provided without considering the cost, center positions of all the through holes are located on the first axis, and all the through holes are mirror symmetrical about the first axis.

The second one is as follows: referring to FIG. 2b, the conductor 100 for a current under test is provided with two through holes 101b and 101c, the cross-section shapes of the two through holes 101b and 101c are symmetrical about the first axis 01, and center positions of the two through holes 101b and 101c are symmetrical about the first axis 01. In this setting mode, the cross-section shapes of the two through holes 101b and 101c may be a regular shape or an irregular shape, as long as the two through holes are mirror symmetrical about the first axis 01.

It should be noted that FIG. 2 only takes two through holes as an example, which is not for limitation. In other embodiments, multiple pairs of through holes that are mirror symmetrical about the first axis may also be provided along a direction parallel to the second axis 02. In addition, multiple pairs of through holes that are mirror symmetrical about the first axis may also be provided at intervals along the first axis.

The third one is as follows: referring to FIG. 2c, the conductor 100 for a current under test is provided with three through holes 101a, 101b and 101c, and vertical projections of the three through holes 101a, 101b and 101c on the first cross section are symmetrical about the first axis 01, wherein a center of the through hole 101a is located on the first axis 01, and centers of the other two through holes 101b and 101c are symmetrical about the first axis 01. This setting mode is the superposition of the above two setting modes, and reference may be made to the above explanation of the setting modes shown in FIG. 2a and FIG. 2b, which will not be elaborated herein.

It can be seen that no matter how many through holes are provided, the principle that the vertical projections of the through holes on the first cross section are symmetrical about the first axis 01 is always followed. The difference between different setting modes is that the setting positions (center positions) of different numbers of through holes are different.

It should be noted here that, in FIG. 2a to FIG. 2c, different reference numerals are given to the through holes according to the position difference of the through holes to show the difference. In the subsequent drawings, the same reference numerals are used for the through holes at the same positions. The setting mode of the through holes may adopt any one of the above three modes, which is not limited in the embodiments of the present invention.

In addition, it should be noted that the magnitude of the magnetic field at the corresponding measurement position may be adjusted by scaling the diameter of the through hole. The diameter of the through hole may be set by those skilled in the art according to actual requirements, which is not limited herein.

As mentioned above, due to the setting of the through hole, the current trend of the conductor for a current under test is changed, so that a magnetic field is distributed in the through hole, and the current introduced into the conductor for a current under test may be determined by detecting the intensity of the magnetic field in the through hole. In order to understand the technical solutions of the embodiments of the present invention conveniently, the distribution situation of the magnetic field in the through hole is analyzed below by taking the setting modes of the through holes shown in FIG. 2a and FIG. 2b as an example, so that the setting mode of the magnetic probe in the through hole is obtained.

Figure 4A:
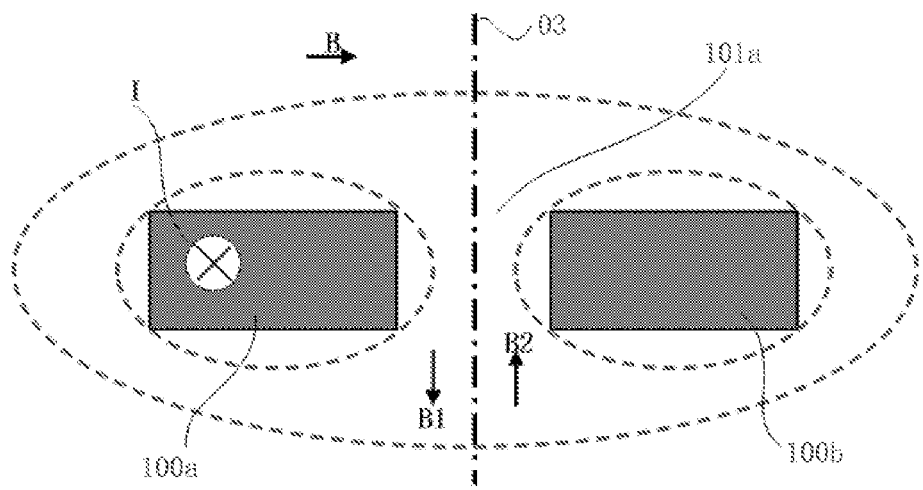

FIG. 4a is a schematic diagram of magnetic field distribution corresponding to the setting mode in FIG. 2a and shows the magnetic field distribution situation in the through hole 101a along a cross section perpendicular to the first axis 01 (current direction I). In the figure, a magnetic induction line is indicated by a dotted line. It can be seen from FIG. 4a that the conductor for a current under test is partially divided by the through hole 101a into two parts, conductor 100a and 100b, and the current directions of the two conductors are both I. The direction of the magnetic field generated by the current around the conductor for a current under test is B, the direction of the magnetic field at the through hole 101a near the conductor 100a is B1, and the direction of the magnetic field at the through hole 100a near the conductor 100b is B2. The through hole 101a is mirror symmetrical about the first axis 01 (the third axis 03), so that the two conductors 100a and 100b that are symmetrical about the first axis 01 have the same current intensity. According to the superposition principle, the total magnetic field intensity of the through hole 101a along the third axis 03 is zero, and the magnetic fields along the two sides of the third axis 03 are symmetrical, equal in intensity, and opposite in direction, and form a magnetic field differential structure.

Figure 4B:
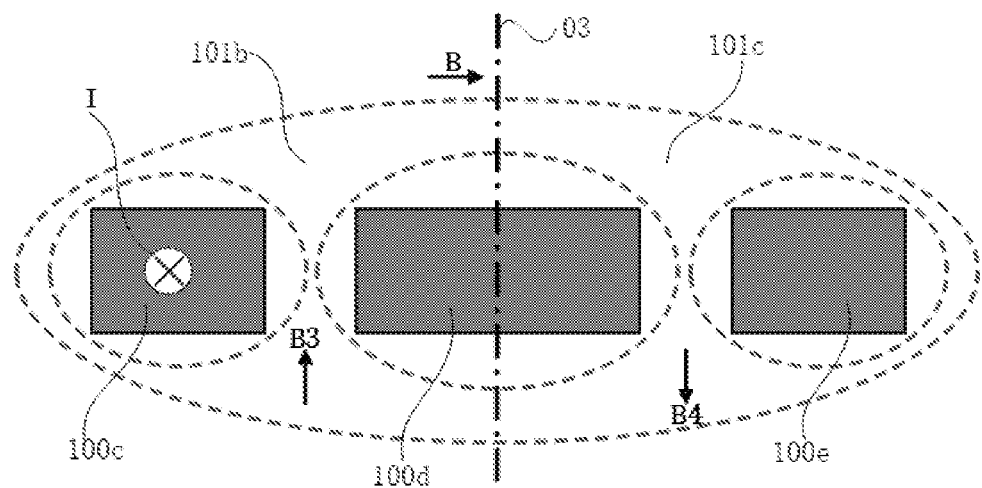
FIG. 4b is a schematic diagram of magnetic field distribution corresponding to the setting mode in FIG. 2b.

FIG. 4b is a schematic diagram of magnetic field distribution corresponding to the setting mode in FIG. 2b and shows the magnetic field distribution situation in the through holes 101b and 101c along a cross section perpendicular to the first axis 01 (current direction I). In the figure, a magnetic induction line is indicated by a dotted line. It can be seen from FIG. 4b that the conductor for a current under test is partially divided by the through holes 101b and 101c into three parts, conductors 100c, 100d and 100e; the current directions of the three conductors are all I; the direction of the magnetic field generated by the current around the conductor for a current under test is B, the direction of the magnetic field generated in the through hole 101b is B3, and the direction of the magnetic field generated in the through hole 101c is B4; and since the through holes 101b and 101c are mirror symmetrical about the first axis 01 (the third axis 03), according to the superposition principle, the magnetic fields in the through hole 101b and the through hole 101c are symmetrical about the third axis 03, equal in intensity, and opposite in direction, and form a magnetic field differential structure.

According to the above analysis, the magnetic field distribution in the through holes that are mirror symmetrical about the third axis 03 are also symmetrical about the third axis 03, and are equal in intensity, and opposite in direction. Therefore, the magnetic probe may be arranged in the through hole, so that a differential magnetic probe is formed, the intensity of the magnetic field in the through hole is obtained, and the current of the conductor for a current under test is measured according to the intensity of the magnetic field. The setting mode of the through hole shown in FIG. 2c covers the setting modes of the through holes shown in FIG. 2a and FIG. 2b, and the current measurement device shown in FIG. 3 corresponds to the setting mode of the through hole shown in FIG. 2c. Therefore, the technical solutions of the embodiments of the present invention are described in detail below only by taking the current measurement device shown in FIG. 3 as an example. In other setting modes of the through holes (FIG. 2a and FIG. 2b), the structure of the current measurement device may be design with reference to FIG. 3.

Referring to FIG. 3, the conductor for a current under test is divided by the through holes 101a, 101b and 101c into four parts, conductors 100c, 100a, 100b and 100e. According to the above analysis on the magnetic field distribution in the through hole, the direction of the magnetic field in the through hole 101a near the conductor 100a is B1, the direction of the magnetic field in the through hole 101a near the conductor 100b is B2, the direction of the magnetic field in the through hole 101b is B3, and the direction of the magnetic field in the through hole 101c is B4. In this embodiment, the magnetic probe is formed by a plurality of magnetically sensitive devices 200a, 200b, 200c and 200d. A vertical projection of the magnetic probe formed by all the devices on the first cross section is symmetrical about the first axis 01, or the magnetic probe is mirror symmetrical about the third axis 03 on the cross section shown in FIG. 3, so that a differential magnetic probe is formed to obtain a magnetic field after superposition of induction magnetic fields generated by currents introduced into the four conductors 100c, 100a, 100b and 100e, and a magnetic field signal is converted into a voltage signal for output; and the voltage signal is further processed by the programmable chip 400 to obtain a target voltage signal that represents the current under test. Exemplarily, the magnetic probe is electrically connected to the programmable chip 400 through a circuit board 500, and the structures of the magnetic probe and the programmable chip 400 will be described in detail later and will not be elaborated herein.

Similarly, for the setting mode of the through hole shown in FIG. 2a, the magnetic probe may include devices 200a and 200b; and for the setting mode of the through hole shown in FIG. 2b, the magnetic probe may include devices 200c and 200d, and the specific working principle is the same as the structure shown in FIG. 3, which will not be elaborated herein.

The current measurement device further has good ability of resisting interference of an external magnetic field. The principle will be analyzed by taking the case where only the through hole 101a is provided as an example. Referring to FIG. 3, when the current measurement device for a current under test is only provided with the through hole 101a, the devices 200a and 200b form a differential magnetic probe to detect the intensity of the magnetic field in the through hole 101a. In the figure, B' represents a direction of an external interference magnetic field. When the external interference magnetic field is present in the through hole 101a, the magnetic field sensed by the device 200a is the sum of the superposition of the induction magnetic fields generated by currents passing through the conductors 100a and 100b and the external interference magnetic field, and the magnetic field sensed by the device 200b is the difference between the superposition of the induction magnetic fields generated by currents passing through the conductors 100a and 100b and the external interference magnetic field. Since the devices 200a and 200b are mirror symmetrical about the third axis 03 and have the consistent characteristic, the effects of the external interference magnetic field on the devices 200a and 200b trade off, and the effect on the differential magnetic probe is zero, so that the ability of the current measurement device resisting the interference of an external magnetic field is improved.

In this embodiment, the magnetic bias structure is provided, so that the magnetization direction of the magnetic bias structure is perpendicular to the sensitive direction of the magnetic probe, and output can be stabilized, thereby improving the measurement accuracy.

According to the embodiments of the present invention, the conductor for a current under test is provided with the through holes that are mirror symmetrical about the first axis, so that after the current under test is introduced into the conductor for a current under test, two parts of the conductors symmetrical about the first axis have the same current intensity; and the magnetic probe is provided within the through holes to detect the magnetic field generated by the conductor for a current under test and convert the magnetic field signal into a voltage signal, and the voltage signal is processed by the programmable chip to obtain a target voltage signal corresponding to the current under test, so information such as the amplitude and phase of the current under test can be determined according to the target voltage signal. In the embodiments of the present invention, the magnetic probe is provided within the through holes of the conductor for a current under test, so that the magnetic field at the measurement point is utilized, and the ability of the measurement device resisting the interference of an external magnetic field is improved, thereby improving the accuracy of the measurement result. In addition, the embodiments of the present invention do not require the magnetism gathering ring structure, thereby completely getting rid of the limitation of the size of the conductor for a current under test on the volume of the current measurement device. Therefore, the measurement device is suitable for different application environments, the applicability and practicability of the measurement device are improved, and it is beneficial to the miniaturization design of the measurement device.

Based on the above embodiments and for the convenience of description, the technical solutions of the embodiments of the present invention are further explained and described below only by taking the case where the conductor for a current under test is provided with a single through hole 101a (referring to FIG. 2b) as an example. When the through holes are provided according to the modes shown in FIG. 2b and FIG. 2c, the specific scheme may be correspondingly set with reference to the following content, which will not be elaborated later.

Optionally, vertical projections of the through holes on the first cross section are symmetrical about the second axis 02.

Figure 5A:
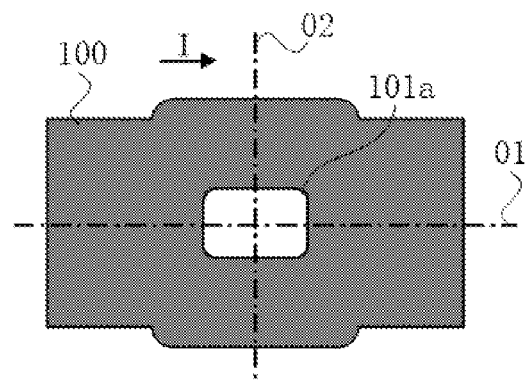
FIG. 5a and FIG. 5b are respectively schematic diagrams of setting modes of another two conductors for a current under test and through holes thereof according to embodiments of the present invention.
Figure 5B:
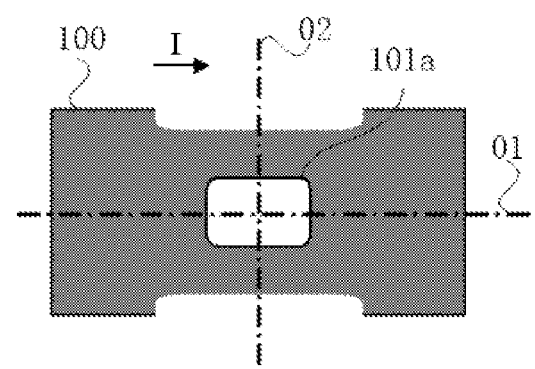

Exemplarily, FIG. 5a and FIG. 5b are respectively schematic diagrams of setting modes of another two conductors for a current under test and through holes thereof according to embodiments of the present invention, and are further optimized on the basis of the regular conductor for a current under test shown in FIG. 2a. Specifically, in FIG. 5a, the conductor 100 for a current under test is provided with a partially protruding structure, so that the intensity of the magnetic field at the corresponding measurement position of the through hole 101a is reduced; and in FIG. 5b, the conductor 100 for a current under test is provided with a partially recessed structure, so that the intensity of the magnetic field at the corresponding measurement position of the through hole 101a is increased. When the first cross section of the conductor for a current under test has an irregular shape, in order to ensure the accuracy of the measurement result, the vertical projection of the through hole on the first cross section needs to be symmetrical about the first axis 01 and also needs to be symmetrical about the second axis 02.

It should be noted that FIG. 2a, FIG. 2b and FIG. 2c respectively show the schematic structural diagrams in which the through holes are mirror symmetrical about the first axis 01 and the second axis 02 when the conductor 100 for a current under test has a regular structure. When the conductor for a current under test has an irregular structure shown in FIG. 5a or FIG. 5b, the through holes may be correspondingly provided with reference to FIG. 2a, FIG. 2b and FIG. 2c. When the conductor 100 for a current under test has a regular structure, the through holes only need to be mirror symmetrical about the first axis 01, and whether the through holes are mirror symmetrical about the second axis 02 is not limited.

Optionally, the shapes of the vertical projections of the through holes on the first cross section include any one of rectangle, circle, and ellipse.

Figure 6:
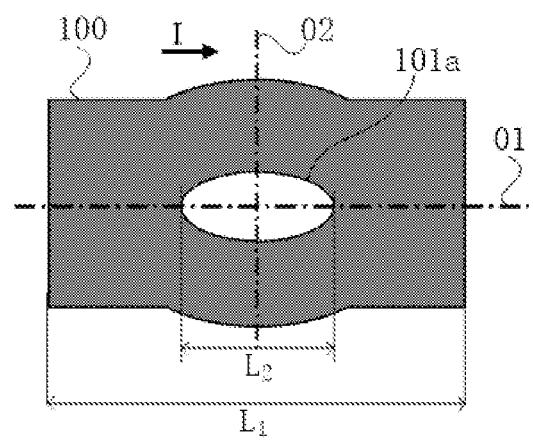
FIG. 6 is a schematic diagram of a setting mode of another conductor for a current under test and through holes thereof according to embodiments of the present invention.

Exemplarily, FIG. 6 is a schematic diagram of a setting mode of another conductor for a current under test and through holes thereof according to embodiments of the present invention. FIG. 6 shows a schematic structural diagram in which the conductor 100 for a current under test has an irregular shape, and the cross-section shape of the through hole 101a is an ellipse. For other setting modes, reference may be made to this and will not be elaborated herein.

Referring to FIG. 2a or FIG. 6, optionally, in a direction where the first axis 01 is located, a length $L_1$ of the conductor for a current under test and a length $L_2$ of the through holes meet $L_1 \geq 3L_2$. In this way, the conductor for a current under test can at least cover an area that is 3 times the diameter length of the through holes in an extension direction (the first axis 01), so that the currents under test passing through the symmetrical sides of the through holes are distributed uniformly.

Here, the setting modes of the conductor for a current under test and the through holes thereof in the embodiments of the present invention are summarized as follows: those skilled in the art may set the shape of the first cross section of the conductor for a current under test, the number of the through holes, the setting positions of the through holes and the shape of the first cross section of the through holes according to actual requirements, but it is necessary to follow the principle that the through holes are mirror symmetrical about the first axis; when the conductor for a current under test has an irregular structure, the through holes need to be mirror symmetrical about the second axis; and in addition, preferably, the conductor for a current under test at least covers an area that is 3 times the diameter length of the through holes in the extension direction.

The setting mode of the magnetic probe is described in detail below. Optionally, the device further includes a circuit board. The magnetic probe includes M groups of magnetoresistive sensors, each group of the magnetoresistive sensors comprises N pairs of magnetoresistive elements, the magnetoresistive elements are arranged on the circuit board, vertical projections of each pair of the magnetoresistive elements on the first cross section are symmetrical about the first axis 01, sensitive directions of each pair of the magnetoresistive elements are parallel and opposite to each other, M and N are positive integers, and $M \geq 1$, $N \geq 1$.

Exemplarily, the above magnetically sensitive devices may adopt the magnetoresistive elements. The magnetoresistive elements can be fixed and electrically connected to the programmable chip through the circuit board. Optionally, the magnetoresistive elements may be Hall sensors, anisotropic magnetoresistive sensors, giant magnetoresistive sensors or tunnel magnetoresistive sensors. In this embodiment, the magnetic probe includes at least one group of magnetoresistive sensors, and each group of magnetoresistive sensors at least include a pair of magnetoresistive sensors. The vertical projections of the paired magnetoresistive elements on the first cross section are symmetrical about the first axis 01, and sensitive directions of each pair of magnetoresistive elements are parallel and opposite to each other; therefore, the magnetoresistive sensors may form a differential magnetic field detection unit for detecting the intensity of the magnetic field in the through hole.

Figure 7:
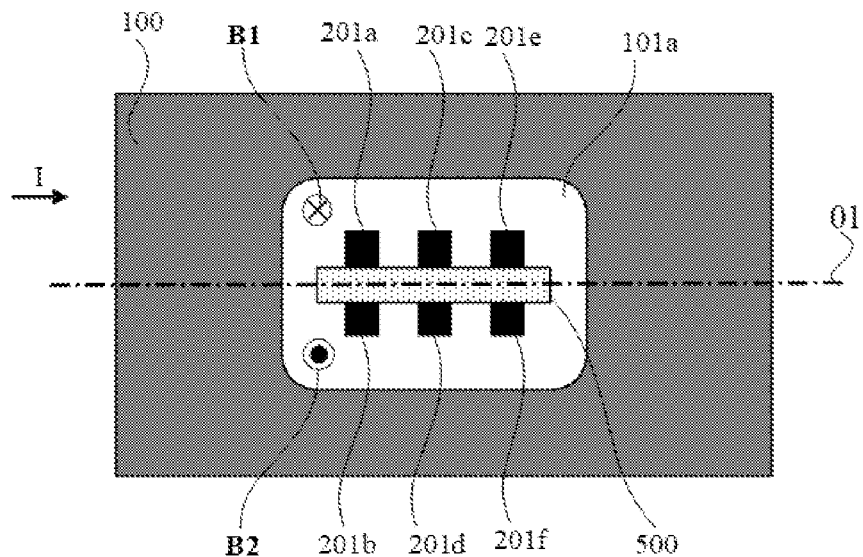
FIG. 7 is a schematic diagram of a setting mode of a magnetic probe according to embodiments of the present invention.

Exemplarily, FIG. 7 is a schematic diagram of a setting mode of a magnetic probe according to embodiments of the present invention, and the setting mode of the magnetic probe is described by taking the case where a single through hole 101*a* is provided as an example. In FIG. 7, the magnetic probe includes three groups of magnetoresistive sensors, and each group of magnetoresistive sensors includes one pair of magnetoresistive elements. Specifically, referring to FIG. 7, the current direction of the conductor 100 for a current under test is I, the through hole 101*a* is equally divided into an upper part and a lower part along the first axis 01 of the conductor 100 for a current under test, and the directions of the magnetic fields of the upper and lower half parts are respectively B1 and B2. There are 6 magnetoresistive elements, which are respectively represented by 201*a*-201*f*. The magnetoresistive elements 201*a*, 201*c* and 201*e* are arranged on the front side of the circuit board 500 at intervals, the magnetoresistive elements 201*b*, 201*d* and 201*f* are arranged on the back side of the circuit board 500 at intervals, and the magnetoresistive elements 201*a*, 201*c* and 201*e* and the magnetoresistive elements 201*b*, 201*d* and 201*f* are mirror symmetrical about the first axis 01. The sensitive direction of the magnetoresistive elements 201*a*, 201*c* and 201*e* is B1 and is the same as the direction of the magnetic field generated by the introduced current in the area of the through hole 101*a*; the sensitive direction of the magnetoresistive elements 201*b*, 201*d* and 201*f* is B2 and is the same as the direction of the magnetic field generated by the introduced current in the area of the through hole 101*a*. The magnetoresistive elements 201*a* and 201*b* form a first group of magnetoresistive sensors, the magnetoresistive elements 201*c* and 201*d* form a second group of magnetoresistive sensors, and the magnetoresistive elements 201*e* and 201*f* form a third group of magnetoresistive sensors; therefore, each group of magnetoresistive sensors may respectively form a differential magnetic field detection unit that can detect the intensity of the magnetic field in the through hole 101*a*. The magnetic probe formed by the three groups of magnetoresistive sensors forms one group of output so as to measure the current passing through the conductor 100 for a current under test. The output signal is an average value output by the plurality of sensors, so the measurement device has high signal-to-noise ratio and fault tolerance rate.

In order to understand the setting mode of the magnetic probe conveniently, the setting mode of the magnetic probe corresponding to the setting modes of the through holes shown in FIG. 2*b* and FIG. 2*c* will be briefly described below.

For the setting mode of the through hole shown in FIG. 2*c*, referring to FIG. 3, the magnetically sensitive devices 200*a* and 200*b* may form a first group of magnetoresistive sensors, the magnetically sensitive devices 200*c* and 200*d* may form a second group of magnetoresistive sensors, and the first group of sensors and the second group of sensors form the magnetic probe to form one group of output for measuring the current passing through the conductor for a current under test. It should be noted that the first group of magnetoresistive sensors and the second group of magnetoresistive sensors may include multiple pairs of magnetoresistive elements. Referring to FIG. 7, a plurality of magnetoresistive elements can be arranged in parallel and at intervals along the first axis at the corresponding positions of 200*a*, 200*b*, 200*a* and 200*b*.

For the setting mode of the through hole shown in FIG. 2*b*, the setting mode of the magnetic probe may refer to the setting mode of the second group of magnetoresistive sensors in FIG. 3, which will not be elaborated herein.

It should be noted that FIG. 7 only shows the setting mode of the magnetic probe when the surface, provided with the magnetoresistive elements, of the circuit board 500 is parallel to the first axis 01. In other embodiments, the surface, provided with the magnetoresistive elements, of the circuit board 500 may also be parallel to the second axis 02; and the paired magnetoresistive elements can be arranged on the same side of the circuit board 500, and ensured to be mirror symmetrical about the first axis 01.

The magnetic bias structure has various different setting modes, which can be set as required and will not be limited by the embodiments of the present invention. Here, the embodiments of the present invention provide three setting modes of the magnetic bias structure. Optionally, the magnetic bias structure and the magnetoresistive elements are arranged on the same side of the circuit board; and/or the magnetic bias structure and the magnetoresistive elements are respectively located on two opposite sides of the circuit board.

Figure 8A:
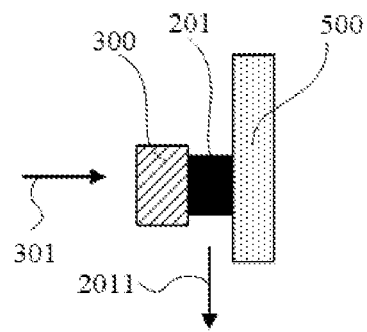
FIG. 8a to FIG. 8c are schematic diagrams of setting modes of magnetic bias structures according to embodiments of the present invention.

FIG. 8*a* is a schematic diagram of the first setting mode of the magnetic bias structure. In the figure, the magnetoresistive element 201 and the magnetic bias structure 300 are arranged on the same side of the circuit board 500. The sensitive direction of the magnetoresistive element 201 is 2011, the magnetization direction of the magnetic bias structure 300 is 301, and the sensitive direction of the magnetoresistive element is perpendicular to the magnetization direction of the magnetic bias structure.

Figure 8B:
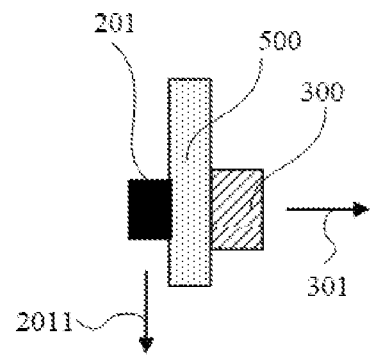

FIG. 8*b* is a schematic diagram of the second setting mode of the magnetic bias structure. In the figure, the magnetoresistive element 201 and the magnetic bias structure 300 are respectively arranged on two sides of the circuit board 500. The sensitive direction of the magnetoresistive element 201 is 2011, the magnetization direction of the magnetic bias structure 300 is 301, and the sensitive direction of the magnetoresistive element is perpendicular to the magnetization direction of the bias magnetic block.

Figure 8C:
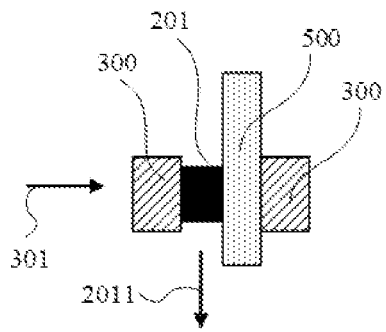

FIG. 8*c* is a schematic diagram of the third setting mode of the magnetic bias structure. In the figure, the magnetoresistive element 201 is arranged on one side of the circuit board 500, and the magnetic bias structures 300*a* and 300*b* are respectively arranged on two sides of the circuit boards 500. The sensitive direction of the magnetoresistive element 201 is 2011, the magnetization directions of the magnetic bias structures 300*a* and 300*b* are 301, and the sensitive direction of the magnetoresistive element is perpendicular to the magnetization directions of the magnetic bias structures.

Optionally, the magnetic bias structure is a permanent magnet, and the permanent magnet is made of any one of neodymium iron boron, samarium cobalt, aluminum nickel cobalt and ferrite. Those skilled in the art can choose the material of the magnetic bias structure as required, which is not limited by the embodiments of the present invention.

Figure 9:
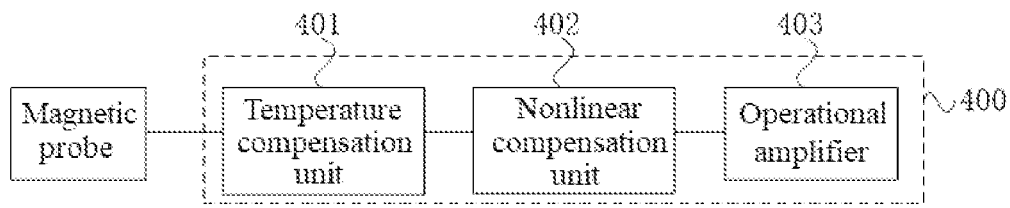
FIG. 9 is a schematic structural diagram of a programmable chip according to embodiments of the present invention.

FIG. 9 is a schematic structural diagram of a programmable chip according to embodiments of the present invention. Optionally, the programmable chip 400 includes: a temperature compensation unit 401, a nonlinear compensation unit 402 and an operational amplifier 403, where the temperature compensation unit 401 is electrically connected to the magnetic probe; the nonlinear compensation unit 402 is electrically connected between the temperature compensation unit 401 and the operational amplifier 403; the temperature compensation unit 401 is used to perform temperature compensation on a voltage signal output by the magnetic probe to obtain a primary voltage signal; the nonlinear compensation unit 402 is used to perform nonlinear compensation on the primary voltage signal to obtain a secondary voltage signal; and the operational amplifier 403 is used to linearly amplify the secondary voltage signal to obtain a target voltage signal.

The voltage signal output by the magnetic probe may be subjected to temperature compensation, nonlinear compensation and linear amplification by the programmable chip 400, so that the accuracy of the detection result can be ensured, and the target voltage signal obtained through processing can feed back the amplitude and phase information of the current under test in real time.

Figure 10:
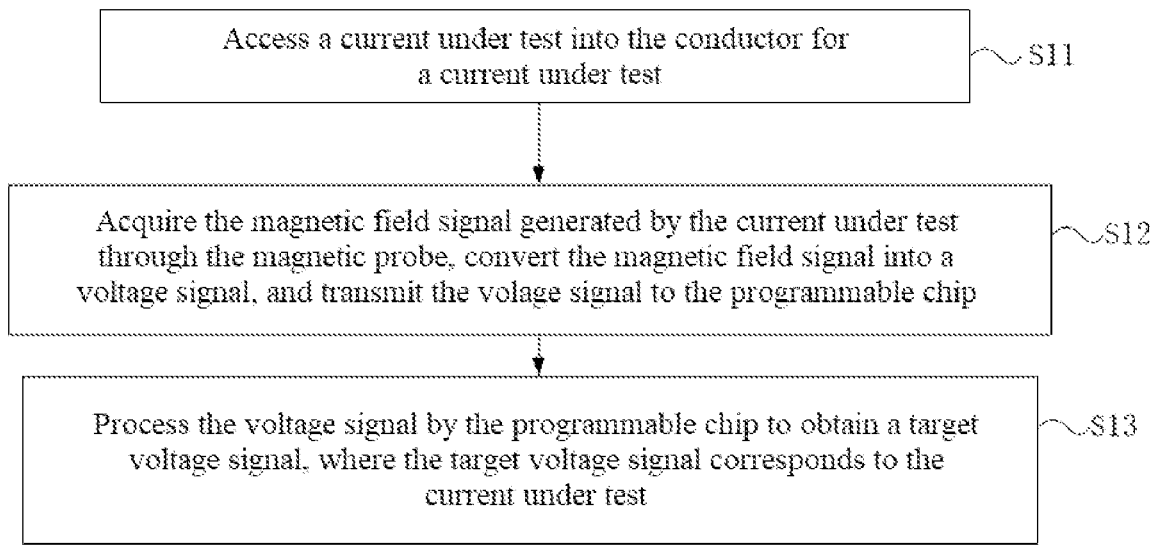
FIG. 10 is a schematic flowchart of a current measurement method according to embodiments of the present invention.

The embodiments of the present invention further provide a current measurement method, which is performed by the current measurement device above. Exemplarily, FIG. 10 is a schematic flow chart of a current measurement method according to embodiments of the present invention. Referring to FIG. 10, the current measurement method includes the following:

S11: a current under test is accessed into the conductor for a current under test;

S12: a magnetic field signal generated by the current under test is acquired through the magnetic probe, the magnetic field signal is converted into a voltage signal, and the voltage signal is transmitted to the programmable chip; and S13: the voltage signal is processed by the programmable chip to obtain a target voltage signal, where the target voltage signal corresponds to the current under test.

According to the current measurement method provided by the embodiments of the present invention, the magnetic field signal generated by the current under test is acquired through the magnetic probe, the magnetic field signal is converted into the voltage signal, the voltage signal is transmitted to the programmable chip, and the voltage signal is processed by the programmable chip to obtain the target voltage signal. Since the target voltage signal corresponds to the current under test, information such as amplitude and phase of the current under test can be determined according to the target voltage signal. The current measurement method has high measurement accuracy and strong ability to resist the interference of an external magnetic field.

It should be noted that the above are only preferred embodiments and the applied technical principle. Those skilled in the art will understand that the present invention is not limited to the specific embodiments described here. Various obvious changes, readjustments and substitutions can be made by those skilled in the art without departing from the protection scope of the present invention. Therefore, although the present invention has been described in detail through the above embodiments, the present invention is not limited to the above embodiments, and may include more other equivalent embodiments without departing from the concept of the present invention. The scope of the present invention is determined by the scope of the appended claims.

The invention claimed is:

1. A magnetic probe-based current measurement device, comprising:
a conductor for a current under test,
a magnetic probe,
a magnetic bias structure, and
a programmable chip;
wherein
the conductor for a current under test has a first axis, a second axis, and a third axis, the first axis is parallel to a current direction of the conductor for a current under test, the second axis and the first axis are perpendicular to each other and form a first cross section, and the third axis is perpendicular to the first cross section;
the conductor for a current under test is provided with one or more through holes, the direction of the one or more through holes is parallel to the third axis, and vertical projections of the one or more through holes on the first cross section are symmetrical about the first axis;
the magnetic probe includes devices to form a differential magnetic probe within each of the one or more through holes, and is electrically connected to the programmable chip, and a sensitive center position for each of the devices of the magnetic probe is located on the first cross section;
the magnetic bias structure is provided within the one or more through holes, and a magnetization direction of the magnetic bias structure is perpendicular to a sensitive direction of the magnetic probe, and both the magnetic probe and the magnetic bias structure are symmetrical about the first axis; and
the magnetic probe is used to acquire a magnetic field signal generated by the current under test introduced into the conductor for a current under test, convert the magnetic field signal into a voltage signal, and transmit the voltage signal to the programmable chip; and the programmable chip is used to process the voltage signal to obtain a target voltage signal, and the target voltage signal corresponds to the current under test.

2. The current measurement device according to claim 1, wherein the vertical projections of the one or more through holes on the first cross section are symmetrical about the second axis.

3. The current measurement device according to claim 2, wherein in a direction where the first axis is located, a length $L_1$ of the conductor for a current under test and a length $L_2$ of the one or more through holes meet $L_1 \geq 3L_2$.

4. The current measurement device according to claim 1, further comprising a circuit board,
wherein the magnetic probe comprises M groups of magnetoresistive sensors, each group of the magnetoresistive sensors comprises N pairs of magnetoresistive elements, the magnetoresistive elements are arranged on the circuit board, vertical projections of each pair of the magnetoresistive elements on the first cross section are symmetrical about the first axis, sensitive directions of each pair of the magnetoresistive elements are parallel and opposite to each other, M and N are positive integers, and $M \geq 1$, $N \geq 1$.

5. The current measurement device according to claim 4, wherein the magnetic bias structure and the magnetoresistive elements are arranged on a same side of the circuit board.

6. The current measurement device according to claim 4, wherein the magnetic bias structure and the magnetoresistive elements are respectively located on two opposite sides of the circuit board.

7. The current measurement device according to claim 1, wherein the vertical projections of the through holes on the first cross section have a shape comprising any one of rectangle, circle, and ellipse.

8. The current measurement device according to claim 1, wherein the conductor for a current under test is metal, and a cross-section shape of a cross section perpendicular to the first axis comprises any one of rectangle and circle.

9. The current measurement device according to claim 1, wherein the magnetic bias structure is a permanent magnet, and the permanent magnet is made of any one of neodymium iron boron, samarium cobalt, aluminum nickel cobalt and ferrite.

10. The current measurement device according to claim 1, wherein the programmable chip comprises:
- a temperature compensation unit,
- a nonlinear compensation unit, and
- an operational amplifier;

wherein
- the temperature compensation unit is electrically connected to the magnetic probe, and the nonlinear compensation unit is electrically connected between the temperature compensation unit and the operational amplifier;
- the temperature compensation unit is used to perform temperature compensation on a voltage signal output by the magnetic probe to obtain a primary voltage signal;
- the nonlinear compensation unit is used to perform nonlinear compensation on the primary voltage signal to obtain a secondary voltage signal; and
- the operational amplifier is used to linearly amplify the secondary voltage signal to obtain the target voltage signal.

11. A magnetic probe-based current measurement method, performed by using the current measurement device according to claim 1, and comprising:
- accessing a current under test into the conductor for a current under test,
- acquiring a magnetic field signal generated by the current under test through the magnetic probe, converting the magnetic field signal into a voltage signal, and transmitting the voltage signal to the programmable chip, and
- processing the voltage signal by the programmable chip to obtain a target voltage signal, wherein the target voltage signal corresponds to the current under test.

12. The current measurement device according to claim 1, wherein at least one of the one or more through holes has a center position location on the first axis.

13. The current measurement device according to claim 1, wherein the one or more through holes include at least one pair of through holes, each of the at least one pair of through holes has a center position that is symmetrical about the first axis.

* * * * *